United States Patent [19]

Sunwoo et al.

[11] Patent Number: 5,268,061

[45] Date of Patent: Dec. 7, 1993

[54] METHOD AND APPARATUS FOR PRODUCING A MANGANESE-ZINC FERRITE SINGLE CRYSTAL USING A LOCAL LIQUID POOL FORMATION

[75] Inventors: Kuk H. Sunwoo; Jae Y. Ma, both of Songtan; Tae H. Kim, Seoul, all of Rep. of Korea

[73] Assignee: Samsung Electro-Mechanics Co., Ltd., Kyungki, Rep. of Korea

[21] Appl. No.: 950,214

[22] Filed: Sep. 24, 1992

[30] Foreign Application Priority Data

Dec. 31, 1991 [KR] Rep. of Korea ................ 25721

[51] Int. Cl.$^5$ ............................................. C30B 15/22
[52] U.S. Cl. .................................. 156/608; 156/617.1; 156/618.1; 156/620.2; 156/DIG. 74; 156/DIG. 77; 422/249
[58] Field of Search .............. 156/608, 617.1, 619.1, 156/620.1, 620.2, DIG. 74, DIG. 77; 422/249

[56] References Cited

U.S. PATENT DOCUMENTS

| | | | |
|---|---|---|---|
| 4,379,021 | 4/1983 | Damen et al. | 156/616.3 |
| 4,382,839 | 5/1983 | Torii et al. | 156/616.41 |
| 4,402,787 | 9/1983 | Matsuzawa et al. | 156/621 |
| 4,409,633 | 10/1983 | Watanabe et al. | 366/127 |
| 4,444,615 | 4/1984 | Matsuzawa et al. | 156/603 |
| 4,519,870 | 5/1985 | Matsuzawa et al. | 156/DIG. 65 |
| 4,863,554 | 9/1989 | Kawasaki et al. | 156/617.1 |

FOREIGN PATENT DOCUMENTS 58-125696 7/1983 Japan ................ 156/617.1

OTHER PUBLICATIONS

Derwent, Inc. abstract of JP 60-46993.

Primary Examiner—Robert Kunemund
Attorney, Agent, or Firm—Cushman Darby & Cushman

[57] ABSTRACT

A method and apparatus for producing a manganese-zinc ferrite single crystal using a local liquid pool formation which involves melting of a starting material in a crucible and lowering of the temperature of crucible to make the resultant melt maintain form three phase regions of an upper liquid pool region, an intermediate semi-rigid region and a lower solid region. A pair of heaters are disposed at the upper and side wall portions of crucible and controlled differently from each other so that the formed lower solid region extends at its peripheral portion throughout the inner surface of the side wall portion of the crucible, thereby minimizing the contact of the formed upper liquid pool region with the whole inner surface of the crucible. For monitoring respective temperatures of various portions in the crucible to control the heaters, there are provided thermocouples which includes a thermocouple for the crystal drawing port member, a thermocouple for the upper portion of crucible, a thermocouple for the upper portion of the side wall of crucible and a thermocouple for the lower portion of crucible.

5 Claims, 2 Drawing Sheets

METHOD AND APPARATUS FOR PRODUCING A MANGANESE-ZINC FERRITE SINGLE CRYSTAL USING A LOCAL LIQUID POOL FORMATION

BACKGROUND OF THE INVENTION

1. Field of the Invention

The present invention relates to a method and apparatus for producing a manganese-zinc ferrite single crystal, and more particularly to a method and apparatus for producing a manganese-zinc ferrite single crystal using a local liquid pool formation which involves melting of a crystal starting material in a crucible and lowering of the temperature of crucible to make the resultant melt maintain locally a liquid phase, that is, the melt form three phase regions of a liquid pool region, a semi-rigid region and a solid region.

2. Description of the Prior Art

Generally, a manganese-zinc ferrite single crystal is used as a core material for video heads and is formed in a crucible. However, such a manganese-zinc ferrite single crystal is likely to include an impurity, such as platinum, from the crucible during its formation in the crucible, resulting in a degradation in quality or an occurrence of defects.

For forming such a manganese-zinc ferrite single crystal, there has been conventionally used a floating zone method. However, this method enables only the formation of a single crystal having a diameter of below 10 mm. In producing a single crystal of larger diameter, for example, not less than 10 mm, a Bridgeman method has been mainly used.

In accordance with the Bridgeman method which is illustrated in FIG. 1, first, a seed crystal 23 and a starting material are charged into a platinum crucible 24. The interior of crucible 24 is maintained at a temperature making it possible to provide a constant temperature gradient using heaters 21 and 22 so that the charged starting material is melted. Thereafter, as the crucible 24 is moved downwardly at a proper rate, a single crystal is grown.

Where the bridgeman method is used, a solidification proceeds during the growth of single crystal, resulting in an increase in solidified portions. This increase in solidified portions causes a variation in shift rate of actual solid-liquid interface.

As a result, it is difficult to grow the single crystal under the constant condition throughout the whole length of an ingot. Upon shifting of the solid-liquid interface from the seed crystal to a cone-shaped portion, in particular, if the temperature gradient is improperly controlled at the cone-shaped portion, a phenomenon that the solid-liquid interface forms a shape concaving toward the liquid phase is increased, thereby causing the formed single crystal to be broken into polycrystal or to have defects.

Furthermore, an increased deviation in composition in the growth direction occurs due to an increased evaporation of ZnO generated at the surface of melt and a coring phenomenon caused by non-equilibrium solidification, resulting in a variation in magnetic characteristic along the length of ingot.

For decreasing the deviation in composition, therefore, there has been proposed a method of forming a single crystal using a continuous feeding-type Bridgeman technique wherein starting material tablets of a controlled composition are fed to an auxiliary crucible, to be melted before they are fed to a main crucible. In this method, however, an inclusion of platinum from the auxiliary crucible into a formed single crystal occurs, thereby adversely affecting the single crystal.

Since the melt is in close contact with the inner wall of crucible in the cases of using the conventional Bridgeman methods, stress is also generated which causes a dislocation in the formed single crystal. Such a dislocation undesirably results in a formation of subgrains upon crystal growing and cooling. In the conventional methods, moreover, the platinum crucible should be regenerated after every use thereof, resulting in an increase in manufacture cost.

SUMMARY OF THE INVENTION

Therefore, the present invention has been made in view of the above-mentioned prior art problem and an object of the invention is to provide a method and apparatus for producing a manganese-zinc ferrite single crystal, capable of not only making the control of composition easy so as to prevent an occurrence of crystal defects, but also minimizing the contact area between a crucible and a melt, so as to prevent an inclusion of platinum into a single crystal to be formed, thereby obtaining a high quality of the single crystal.

In one aspect, the present invention provides a method for producing a manganese-zinc ferrite single crystal in a crucible comprising the steps of: charging downwardly a starting material into the crucible; heating the upper portion and the side wall portion of the crucible independently to make the starting material form three phase regions including an upper liquid pool region, an intermediate semi-rigid region and a lower solid region and controlling the heatings such that the formed lower solid region extends at its peripheral portion throughout the inner surface of the side wall portion of the crucible, thereby minimizing the contact of the formed upper liquid pool region with the whole inner surface of the crucible; and contacting a seed crystal with the liquid phase through the crystal drawing port member to form a solid-liquid interface therebetween and then grow a single crystal.

In another aspect, the present invention provides an apparatus for producing a manganese-zinc ferrite single crystal comprising: a crucible having an upper portion, a side wall portion and a lower portion, the upper portion having a crystal drawing port member at its center and a starting material charging port and an oxygen injecting port at its one side; a first heater disposed around the side wall portion of the crucible; a second heater disposed over the upper portion of the crucible and controlled to be maintained at a temperature different from that of the first heater, the second heater together with the first heater functioning to make the starting material charged in the crucible form three phase regions including an upper liquid pool region, an intermediate semi-rigid region and a lower solid region; a plurality of thermocouples adapted to monitor respective temperatures of the portions in the crucible required to control the first and second heaters such that the formed lower solid region extends at its peripheral portion throughout the inner surface of the side wall portion of the crucible, thereby minimizing the contact of the formed upper liquid pool region with the whole inner surface of the crucible; a recess formed around the crystal drawing port member, the recess having a bottom surface disposed at a level lower than the level of the upper surface of the liquid pool region in the crucible; a quartz tube disposed above and communicated with the crystal drawing port member, the quartz tube having a side wall provided with an auxiliary heater arranged around its inner surface and a nitrogen injecting port; a pulling rod disposed to be vertically slidable through the quartz tube, the pulling rod having a lower end carrying a seed crystal and an upper end extending upwardly beyond the quartz tube; and pinch rolls adapted to drive the pulling rod.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
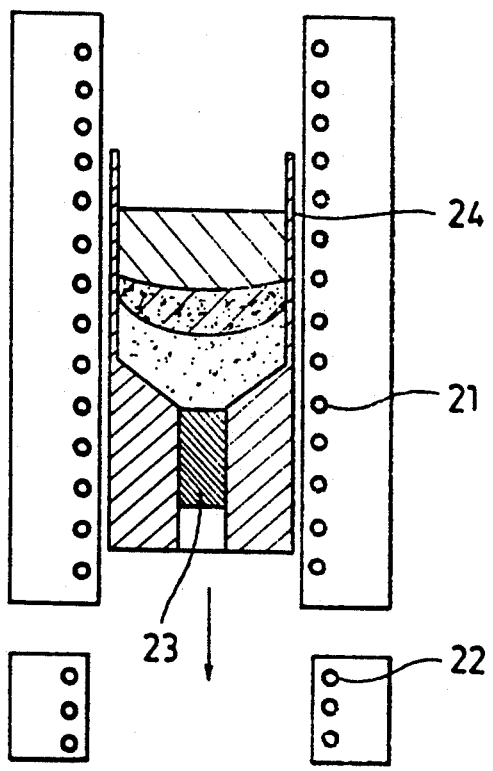
FIG. 1 is a schematic view of an apparatus of growing a manganese-zinc ferrite single crystal according to a conventional Bridgeman method.
Figure 2:
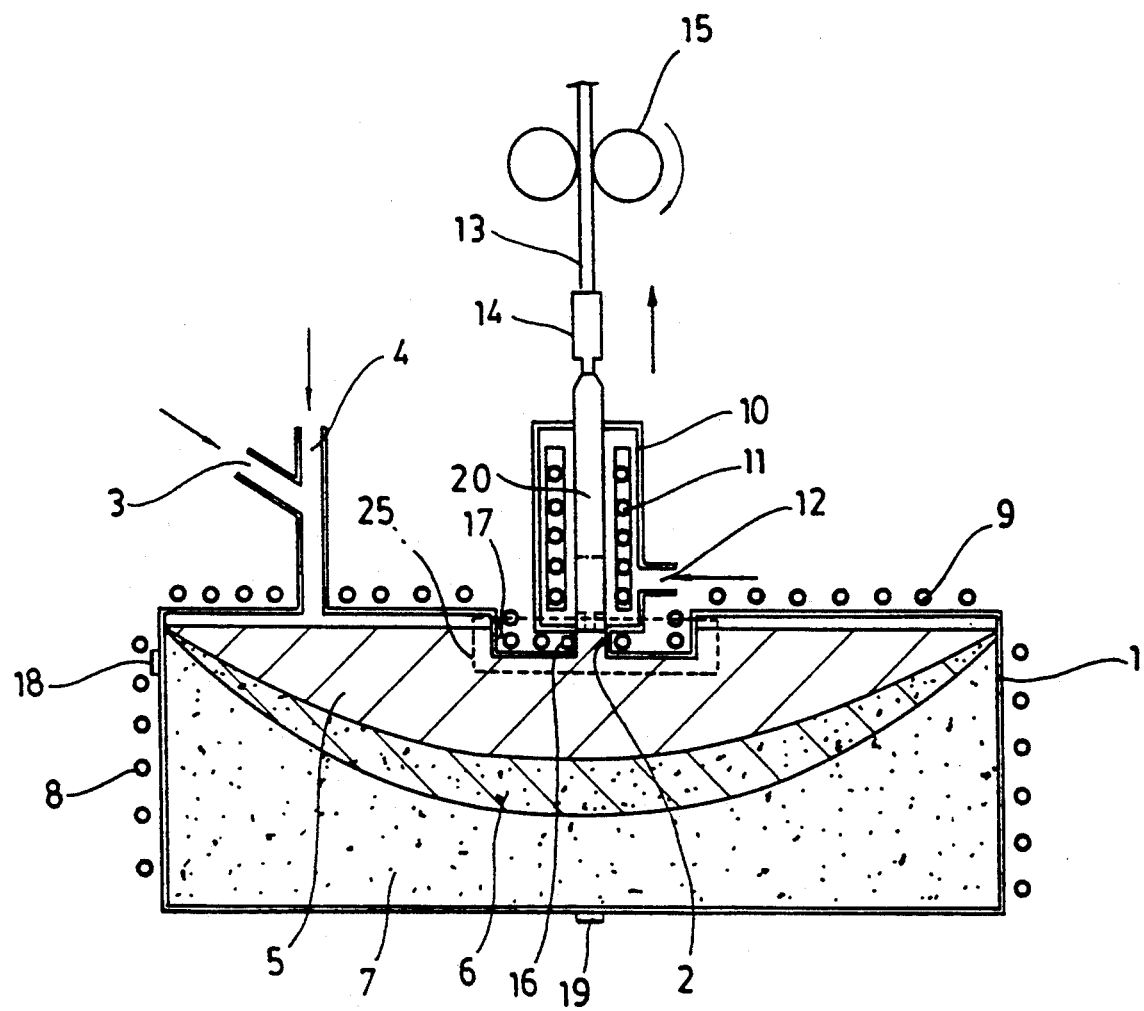
FIG. 2 is a schematic view of an apparatus of growing a manganese-zinc ferrite single crystal according to the present invention.

Referring to FIG. 2, there is illustrated an apparatus for producing a single crystal in accordance with an embodiment of the present invention. As shown in FIG. 2, the apparatus comprises a crucible 1 having a crystal drawing port member 2 at its upper center portion and a starting material charging port 3 and an oxygen injecting port 4 at its one side (in the illustrated embodiment, one side of the upper portion). Around of the side wall of crucible 1, a first heater 8 is disposed. A second heater 9 is also disposed over the upper portion of crucible 1 and is controlled to be maintained at a temperature different from that of the first heater 8. With this construction, the starting material in the crucible 1 forms three phase regions, that is, a liquid pool region 5, a semi-rigid region 6 and a solid region 7.

The crucible 1 is also provided at its upper portion with a recess 25 arranged around the crystal drawing port member 2. The recess 25 has a bottom surface maintained at a level lower than that of the upper surface of liquid region 5 in the crucible 1. With this construction, a capillarity occurs at the crystal drawing port member 2, as will be described hereinafter.

Above the crystal drawing port member 2, a quartz tube 10 is disposed which has an auxiliary heater 11 arranged around the inner surface of its side wall and a nitrogen injecting port 12 provided at the side wall. A pulling rod 13 is also provided which can vertically slide through the quartz tube 10. The pulling rod 13 has a lower end carrying a seed crystal 14 and an upper end extending upwardly beyond the quartz tube 10 and between pinch rolls 15 for feeding the pulling rod 13.

In order to monitor respective temperatures of various portions in the crucible 1, there are provided thermocouples which includes a thermocouple 16 for the crystal drawing port member 2, a thermocouple 17 for the upper portion of crucible 1, a thermocouple 18 for the upper portion of the side wall of crucible 1 and a thermocouple 19 for the lower portion of crucible 1.

In operation, the first and second heaters 8 and 9 are uniformly maintained at a temperature at which the starting material is melt. Under this condition, tablets of the starting material are charged into the platinum crucible 1 through the starting material charging port 3. Oxygen is then injected into the crucible 1 through the oxygen injecting port 4, to stabilize the whole starting material at a predetermined atmosphere.

After achieving the stabilization in temperature, the temperature of the second heater 9 is controlled to be maintained at a level making the temperature in the area between the liquid pool region 5 and the upper portion of crucible 1 higher than the melting point of starting material (for example, about 1,590° C. to about 1,600° C.) by a predetermined value, for example, about 50° C. to about 100° C. At the same time, the temperature of the first heater 8 is controlled to be maintained at a lower level making the temperature of the lower portion of crucible 1 lower than the melting point of starting material by a predetermined value, for example, about 8° C. to about 15° C. As the heaters 8 and 9 are controlled to be maintained at their predetermined temperatures as mentioned above, the melt in the crucible 1 forms three phase regions which correspond to the liquid pool region 5, the semi-rigid region 6 and the solid region 7, respectively.

The control of respective temperatures of the heaters 8 and 9 is achieved by the monitoring operations of thermocouples 16 to 19. That is, the thermocouples 16 to 19 sense respective temperatures of the crystal drawing port member 2, the upper portion of crucible 1, the upper portion of the side wall of crucible 1 and the lower portion of crucible 1, so as to control the heaters 8 and 9. The control is carried out so that the solid region 7 is formed to extend at its peripheral portion throughout the inner surface of the side wall of crucible 1. Accordingly, the melt of growing crystal can hardly come into contact with the platinum crucible 1.

After achieving the stabilization at the desired temperature range, the pulling rod 13 is moved downwardly so that the lower end of the seed crystal 14 attached to the lower end of pulling rod 13 comes into contact with the liquid phase in the crystal drawing port member 2 of crucible 1. As a result of the contact between the seed crystal 14 and the liquid phase in the crystal drawing port member 2, a solid-liquid interface is formed.

At this time, since the level of the upper surface of crucible connector 25 is lower than that of the upper surface of liquid pool region 5, a capillarity occurs in the crystal drawing port member 2. By virtue of such a capillarity, the melt rises slowly in the crystal drawing port member 2 and is then drawn by the pulling rod 13 to be grown in a crystal 20.

Once the crystal is grown as mentioned above, the starting material is continuously charged into the crucible 1 through the starting material charging port 3, while the drawn crystal passes through the auxiliary heater 11 sealably disposed in the quartz tube 10. During the passing of drawn crystal through the quartz tube 10, the crystal is subjected to a nitrogen purging.

As apparent from the above description, the present invention provides a method and apparatus for producing a manganese-zinc ferrite single crystal, capable of growing the single crystal while minimizing the contact of a melt with the inner wall surface of a crucible.

Accordingly, it is possible to prevent impurities contained in the material of crucible and attached to the inner wall of crucible from exuding during the growth of crystal and then from entering the melt. Also, it is possible to reduce greatly the phenomenon that the impurities contained in the starting material react with the material of crucible, thereby causing the crucible to be eroded.

A uniform crystal growth condition (namely, a thermal condition) is also achieved throughout the length of an ingot, in that during the growth of crystal, the temperature gradients at regions extending from the solid-liquid interface toward the liquid phase and toward the solid phase are uniformly maintained. Since once the growth of crystal is achieved, the starting material tablets of a controlled composition are continuously charged into the crucible, the deviation in composition along the length of ingot can be reduced.

The platinum crucible can be used several times without its regeneration, in accordance with the present invention. This eliminates an increase in manufacture cost which has been caused by a regeneration of the platinum crucible after every use thereof upon growing a single crystal using the conventional Bridgeman method.

What is claimed is:

1. A method for producing a manganese-zinc ferrite single crystal in a crucible comprising the steps of:
   charging downwardly a starting material into the crucible;
   heating the upper portion and the side wall portion of the crucible independently to make the starting material form three phase regions including an upper liquid pool region, an intermediate semi-rigid region and a lower solid region and controlling the heatings such that the formed lower solid region extends at its peripheral portion throughout the inner surface of the side wall portion of the crucible, thereby minimizing the contact of the formed upper liquid pool region with the whole inner surface of the crucible; and
   contacting a seed crystal with the liquid phase through the crystal drawing port member to form a solid-liquid interface therebetween and then grow a single crystal.

2. A method in accordance with claim 1, wherein during the growth of the single crystal, the heatings of the upper portion and side wall portion of the crucible are controlled independently so that a region between the upper surface of the liquid pool region and the upper portion of the crucible is maintained at a temperature higher than the melting point of the starting material by 50° C. to 100° C., while the lower portion of the crucible is maintained at a temperature lower than the melting point of starting material by 8° C. to 15° C.

3. A method in accordance with claim 1, wherein the level of the lower end of the crystal drawing port member is lower than the level of the upper surface of the liquid region in the crucible so that a capillary phenomenon occurs at the crystal drawing port member, thereby causing the liquid phase from the liquid region to rise upwardly slowly through the crystal drawing port member.

4. An apparatus for producing a manganese-zinc ferrite single crystal comprising:
   a crucible having an upper portion, a side wall portion and a lower portion, the upper portion having a crystal drawing port member at its center and a starting material charging port and an oxygen injecting port at its one side;
   a first heater disposed around the side wall portion of the crucible;
   a second heater disposed over the upper portion of the crucible and controlled to be maintained at a temperature different from that of the first heater, the second heater together with the first heater functioning to make the starting material charged in the crucible form three phase regions including an upper liquid pool region, an intermediate semi-rigid region and a lower solid region;
   a plurality of thermocouples adapted to monitor respective temperatures of the portions in the crucible required to control the first and second heaters such that the formed lower solid region extends at its peripheral portion throughout the inner surface of the side wall portion of the crucible, thereby minimizing the contact of the formed upper liquid pool region with the whole inner surface of the crucible;
   a recess formed around the crystal drawing port member, the recess having a bottom surface disposed at a level lower than the level of the upper surface of the liquid pool region in the crucible;
   a quartz tube disposed above and communicated with the crystal drawing port member, the quartz tube having a side wall provided with an auxiliary heater arranged around its inner surface and a nitrogen injecting port;
   a pulling rod disposed to be vertically slidable through the quartz tube, the pulling rod having a lower end carrying a seed crystal and an upper end extending upwardly beyond the quartz tube; and
   pinch rolls adapted to drive the pulling rod.

5. An apparatus in accordance with claim 4, wherein the thermocouples comprise four thermocouples for monitoring respective temperatures of the crystal drawing port member, the upper portion of the crucible, the upper portion of the side wall portion of the crucible and the lower portion of the crucible.

* * * * *